United States Patent
Jin

(10) Patent No.: US 10,535,718 B2
(45) Date of Patent: Jan. 14, 2020

(54) PIXEL ARRANGEMENT OF OLED DISPLAY PANEL, AND OLED DISPLAY PANEL

(71) Applicant: Shenzhen China Star Optoelectronics Technology Co., Ltd., Shenzhen, Guangdong (CN)

(72) Inventor: Yufeng Jin, Guangdong (CN)

(73) Assignee: SHENZHEN CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 354 days.

(21) Appl. No.: 15/551,549

(22) PCT Filed: Jul. 6, 2017

(86) PCT No.: PCT/CN2017/092001
§ 371 (c)(1),
(2) Date: Aug. 16, 2017

(87) PCT Pub. No.: WO2018/223475
PCT Pub. Date: Dec. 13, 2018

(65) Prior Publication Data
US 2019/0326365 A1    Oct. 24, 2019

(30) Foreign Application Priority Data

Jun. 9, 2017   (CN) .......................... 2017 1 0430673

(51) Int. Cl.
*H01L 29/08*    (2006.01)
*H01L 33/00*    (2010.01)
(Continued)

(52) U.S. Cl.
CPC ...... *H01L 27/3218* (2013.01); *H01L 27/3216* (2013.01)

(58) Field of Classification Search
CPC ........................ H01L 27/3218; H01L 27/3216
See application file for complete search history.

(56) References Cited

U.S. PATENT DOCUMENTS 7,492,379 B2 *   2/2009   Credelle ........... G02F 1/133514
                                                     345/204
8,159,508 B2 *   4/2012   Lee ..................... H01L 27/3218
                                                     313/582
(Continued)

FOREIGN PATENT DOCUMENTS

CN   203134285 U    8/2013
CN   103278960 A    9/2013
(Continued)

*Primary Examiner* — Alonzo Chambliss

(57) ABSTRACT

Disclosed is a pixel arrangement of an OLED display panel and an OLED display panel. The pixel arrangement includes first sub-pixels and second sub-pixels that are arranged alternately along a row direction. Every other pair of first sub-pixel and second sub-pixel are provided therebetween with two third sub-pixels along the row direction. The first sub-pixels and the third sub-pixels are arranged alternately along a column direction to form a sub-pixel arrangement mode, and the second sub-pixels and the third sub-pixels are arranged alternately to form another sub-pixel arrangement mode. The two sub-pixel arrangement modes are arranged alternately. The pixel arrangement reduces difficulty in manufacturing an OLED display panel.

18 Claims, 2 Drawing Sheets

(51) Int. Cl.
  *H01L 31/0232* (2014.01)
  *H01L 21/00* (2006.01)
  *H01L 51/40* (2006.01)
  *H01L 27/32* (2006.01)

(56) References Cited

U.S. PATENT DOCUMENTS

| | | | |
|---|---|---|---|
| 9,837,476 B2* | 12/2017 | Park | H01L 51/525 |
| 10,347,703 B2* | 7/2019 | Park | H01L 27/3262 |
| 2003/0128225 A1* | 7/2003 | Credelle | G02F 1/133514 |
| | | | 345/694 |
| 2004/0108818 A1 | 6/2004 | Ronald et al. | |
| 2014/0319486 A1* | 10/2014 | Hong | G09G 3/32 |
| | | | 257/40 |
| 2016/0126298 A1* | 5/2016 | Chen | H01L 27/3218 |
| | | | 257/40 |
| 2016/0204094 A1* | 7/2016 | Yang | H01L 27/124 |
| | | | 257/773 |

FOREIGN PATENT DOCUMENTS

| | | |
|---|---|---|
| CN | 205355055 U | 6/2016 |
| CN | 105826348 A | 8/2016 |
| CN | 205845956 U | 12/2016 |

* cited by examiner

PIXEL ARRANGEMENT OF OLED DISPLAY PANEL, AND OLED DISPLAY PANEL

CROSS-REFERENCE TO RELATED APPLICATIONS

This application claims the priority of Chinese patent application CN201710430673.4, entitled "Pixel arrangement of OLED display panel, and OLED display panel" and filed on Jun. 9, 2017, the entirety of which is incorporated herein by reference.

FIELD OF THE INVENTION

The present disclosure relates to the technical field of displays, and in particular, to a pixel arrangement of OLED display panel and an OLED display panel.

BACKGROUND OF THE INVENTION

With the development of organic light-emitting diode (OLED) display technologies, the resolution of display panels is required to be higher and higher. The resolution of an OLED display panel is usually expressed as the product of the number of pixels in a horizontal direction and the number of pixels in a vertical direction. A pixel traditionally consists of three sub-pixels, i.e., a red (R) sub-pixel, a green (G) sub-pixel, and a blue (B) sub-pixel. In order to realize high-resolution performance, density of sub-pixels in a display panel adopting a traditional RGB pixel arrangement must be multiplied. This can greatly increase difficulty and cost in manufacturing the display panel.

SUMMARY OF THE INVENTION

One of the objectives of the present disclosure is to improve the arrangement of sub-pixels, so that high-resolution performance can be achieved with a less number of sub-pixels than used in the prior art, whereby difficulty and cost in manufacturing display panels can both be reduced.

In order to achieve the above objective, the present disclosure first provides an arrangement of sub-pixels of an OLED display panel. The pixel arrangement comprises a plurality of first sub-pixels, a plurality of second sub-pixels, and a plurality of third sub-pixels. The first sub-pixels and the second sub-pixels are arranged alternately along a row direction of the display panel. A gap between every other pair of first sub-pixel and second sub-pixel is provided with two third sub-pixels along the row direction. The first sub-pixels and the third sub-pixels are arranged alternately along a column direction of the display panel to form a first sub-pixel arrangement mode, and the second sub-pixels and the third sub-pixels are arranged alternately along the column direction to form a second sub-pixel arrangement mode. The first sub-pixel arrangement mode and the second sub-pixel arrangement mode are arranged alternately in the row direction.

Preferably, the first sub-pixels and the second sub-pixels are equal in number, and a number of the third sub-pixels is twice the number of the first sub-pixels or the number of the second sub-pixels.

Preferably, along the row direction of the display panel, a distance between the two third sub-pixels provided in the gap between every other pair of first sub-pixel and second sub-pixel is smaller than a distance between two adjacent first sub-pixel and second sub-pixel, a distance between two adjacent first sub-pixel and third sub-pixel, and two adjacent second sub-pixel and third sub-pixel.

Preferably, the third sub-pixels each have an area smaller than those of the first sub-pixels and the second sub-pixels.

Preferably, the first sub-pixels and the second sub-pixels are equal in area.

Preferably, the first sub-pixels, the second sub-pixels, and the third sub-pixels all have a shape of a polygon.

Preferably, the first sub-pixels, the second sub-pixels, and the third sub-pixels are red sub-pixels, blue sub-pixels, and green sub-pixels, respectively, or the first sub-pixels, the second sub-pixels, and the third sub-pixels are blue sub-pixels, red sub-pixels, and green sub-pixels, respectively.

Preferably, when the OLED display panel is used to display an image, each of the first sub-pixels and each of the second sub-pixels are shared by two pixel units.

Preferably, a first pixel unit is formed by a first/second sub-pixel in a $(2k+1)^{th}$ row and a $(2k+1)^{th}$ column, a second/first sub-pixel in a $(2k+2)^{th}$ row and a $(2k+2)^{th}$ column, and a third sub-pixel in the $(2k+1)^{th}$ row and the $(2k+2)^{th}$ column; and a second pixel unit is formed by the first/second sub-pixel in the $(2k+1)^{th}$ row and the $(2k+1)^{th}$ column, the second/first sub-pixel in the $(2k+2)^{th}$ row and the $(2k+2)^{th}$ column, and a third sub-pixel in the $(2k+2)^{th}$ row and the $(2k+1)^{th}$ column. k is an integer larger than or equal to zero.

The present disclosure further provides an OLED display panel, a pixel array of which is arranged according to the above-mentioned pixel arrangement.

When the OLED display panel having the pixel array arranged according to the pixel arrangement of the present disclosure is used to display images, a first sub-pixel and a second sub-pixel each are shared by two different pixel units to form different pixel units. In this way, a high pixel resolution is realized by means of a relatively small number of sub-pixels, and the manufacturing of a high resolution OLED display panel can be made easier and cheaper.

Other advantages, objectives and features of the present disclosure will be further explained in part in the following description, and in part become self-evident to the skilled person in the art based on the study therefrom, or may be learned from practice of the present disclosure. The objectives and other advantages of the present disclosure will be achieved through the structures specifically pointed out in the description, claims, and the accompanying drawings.

BRIEF DESCRIPTION OF THE DRAWINGS

The accompanying drawings are provided for a further understanding of the present disclosure or the existing technologies, and constitute a part of the description. The drawings for the embodiments of the present disclosure, together with the embodiments of the present disclosure, are provided for illustrating the technical solutions of the present disclosure, rather than limiting the present disclosure.

DETAILED DESCRIPTION OF THE EMBODIMENTS

The present disclosure will be explained in detail below with reference to the embodiments and the accompanying drawings, so that one can fully understand how the present disclosure solves the technical problem and achieves the technical effects through the technical means, thereby implementing the same. It should be noted that as long as there is no structural conflict, any of the embodiments and any of the technical features thereof may be combined with one another, and the technical solutions obtained therefrom all fall within the scope of the present disclosure.

Figure 1:
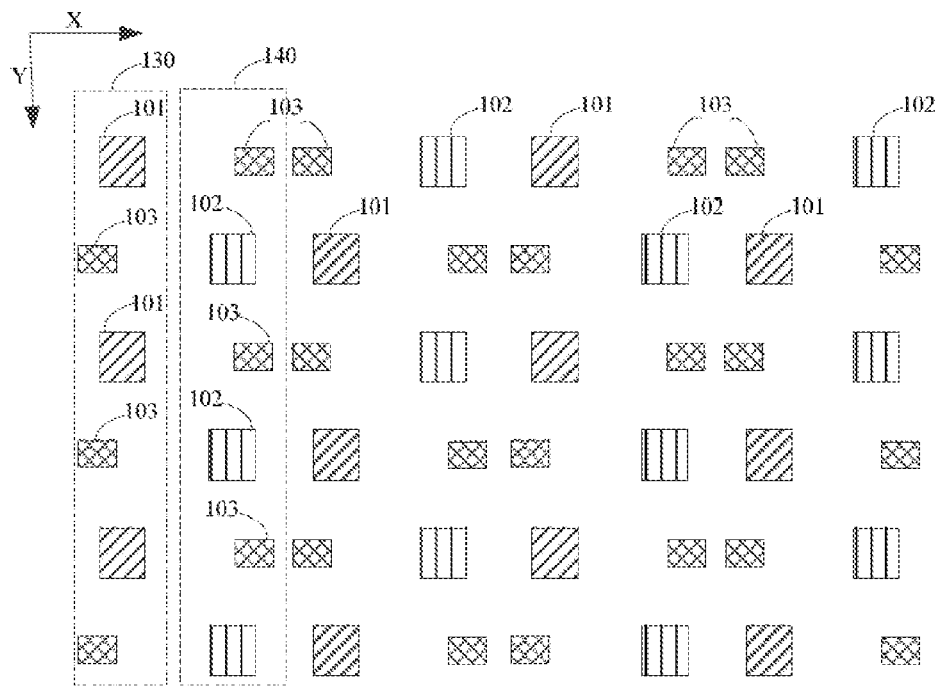
FIG. 1 schematically shows a pixel arrangement provided by an embodiment of the present disclosure.

FIG. 1 schematically shows a pixel arrangement according to an embodiment of the present disclosure.

As shown in FIG. 1, each rectangle in the figure represents a sub-pixel. In the present embodiment, a plurality of pixels together form an array of sub-pixels arranged in a plurality of rows and a plurality of columns. The sub-pixels include a plurality of first sub-pixels 101, a plurality of second sub-pixels 102, and a plurality of third sub-pixels 103. The sub-pixels are arranged in the following ways.

According to the pixel arrangement of the present embodiment, the first sub-pixels 101 and the second sub-pixels 102 are arranged alternately in a row direction (X direction in the figure) of a display panel. As shown specifically in FIG. 1, when the third sub-pixels are not considered, a first row of pixels include a first sub-pixel 101, a second sub-pixel 102, a first sub-pixel 101, a second sub-pixel 102 . . . which are repeated in sequence. A second row of pixels have a similar arrangement as the first row, except that the second sub-pixel 102 is arranged before the first sub-pixel 101. Thus, in the present embodiment, the first sub-pixels 101 and the second sub-pixels 102 are arranged in an alternate manner.

According to the pixel arrangement of the present embodiment, a plurality of gaps formed between the first sub-pixels 101 and the second sub-pixels 102 that are arranged alternately in a row are provided with the first sub-pixels 103. As shown in FIG. 1, one first sub-pixel 101 and one second sub-pixel 102 are considered as a group. In each group, the first sub-pixel 101 and the second sub-pixel 102 are provided in a gap formed therebetween with two third sub-pixels 103 that are side by side in the X direction.

It should be noted that the above-mentioned groups of sub-pixels are selected according to a certain rule. Any two adjacent first sub-pixel 101 and second sub-pixel 102 form a group. Thus a plurality of groups of first sub-pixel 101 and second sub-pixel 102 are formed. Among these groups, every other group of first sub-pixel 101 and second sub-pixel 102 is selected, and is provided with two third sub-pixels 103 that are side by side in a gap formed between the first sub-pixel 101 and second sub-pixel 102 in the X direction.

According to the pixel arrangement of the present embodiment, in a column direction (the Y direction in the figure) of the display panel, the first sub-pixels 101 and the third sub-pixels 103 are arranged alternately to form a first sub-pixel arrangement mode, and the second sub-pixels 102 and the third sub-pixels 103 are arranged alternately to form a second sub-pixel arrangement mode. The first sub-pixel arrangement mode and the second sub-pixel arrangement mode are arranged in an alternate manner in the X direction. Specifically, as shown in FIG. 1, a first column of pixels include only the first sub-pixels 101 and the third sub-pixels 103 that are arranged in an alternate manner to form the first sub-pixel arrangement mode 130. A second column of pixels include only the second sub-pixels 102 and the third sub-pixels 103 that are arranged to form the second sub-pixel arrangement mode 140. A third column of pixels repeat the arrangement of the first column of pixels, and a fourth column of pixels repeat the arrangement of the second column of pixels. All columns of pixels are arranged in a way in which the first sub-pixel arrangement mode and the second sub-pixel arrangement mode are arranged alternately with each other along the X direction.

Further, the first sub-pixel 101 can be a red sub-pixel, the second sub-pixel 102 can be a blue sub-pixel, and the third sub-pixel 103 can be a green sub-pixel. Color of the first sub-pixel 101 and color of the second sub-pixel 102 can be interchanged. In other words, the first sub-pixel 101 can be a blue sub-pixel, and the second sub-pixel 102 can be a red pixel.

In the pixel arrangement of the present embodiment, the first sub-pixels 101 and the second sub-pixels 102 are equal in number, and a number of the third sub-pixels 103 is twice the number of the first sub-pixels 101 or the second sub-pixels 102. Thus, when the above pixel arrangement is adopted to form pixel units to realize display, each of the first sub-pixels 101 and each of the third sub-pixels 102 are simultaneously shared by two pixel units.

Figure 2:
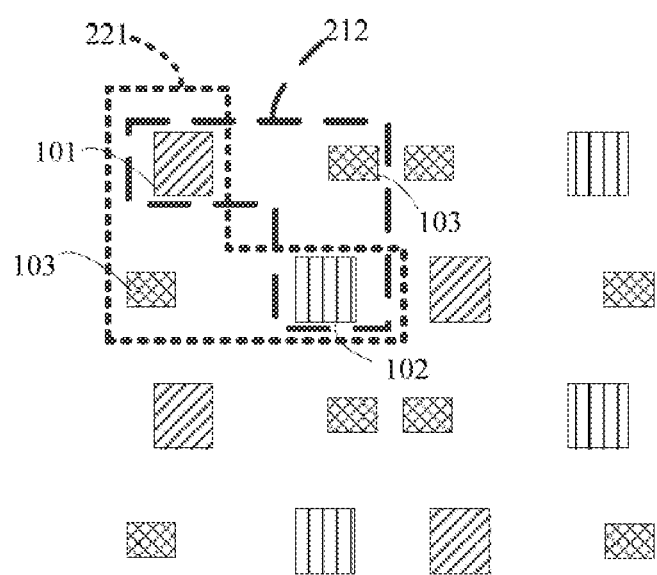
FIG. 2 schematically shows formation of pixel units according to the pixel arrangement provided by the embodiment of the present disclosure.

Specifically, as shown in FIG. 2, a first pixel unit 212 is formed by a first sub-pixel 101 in the first row and the first column, a second sub-pixel 102 in the second row and the second column, and a third sub-pixel 103 in the first row and the second column. A second pixel unit 221 is formed by the first sub-pixel 101 in the first row and the first column, the second sub-pixel 102 in the second row and the second column, and a third sub-pixel 103 in the second row and the first column. The first sub-pixel 101 in the first row and the first column and the second sub-pixel 102 in the second row and the second column are shared by the first pixel unit 212 and the second pixel unit 221.

It should be appreciated that the above relationship is also satisfied when the first sub-pixel 101 and the second sub-pixel 102 exchange their positions.

More generally, the first pixel unit is formed by a first/second sub-pixel in a $(2k+1)^{th}$ row and a $(2k+1)^{th}$ column, a second/first sub-pixel in a $(2k+2)^{th}$ row and a $(2k+2)^{th}$ column, and a third sub-pixel in the $(2k+1)^{th}$ row and the $(2k+2)^{th}$ column. The second pixel unit is formed by the first/second sub-pixel in the $(2k+1)^{th}$ row and the $(2k+1)^{th}$ column, the second/first sub-pixel in the $(2k+2)^{th}$ row and the $(2k+2)^{th}$ column, and a third sub-pixel in the $(2k+2)^{th}$ row and the $(2k+1)^{th}$ column. k is an integer larger than or equal to zero. Sharing of sub-pixels can help to improve the resolution of the OLED display panel, or reduce the number of sub-pixels required to achieve a same resolution.

It is known that human eyes' abilities to recognize colors vary from color to color. Generally speaking, human eyes are much more able to recognize positions of green sub-pixels and bright centers of pixels than to recognize positions of blue and red sub-pixels. With respect to a certain pixel resolution, human eyes can recognize positions of bright centers of pixels and have a normal perception of colors, but human eyes cannot recognize actual positions or borders of blue or red pixels on a pixel scale. When the resolution of a display panel is just about the same as that of a human eye, such a capability difference in recognizing different colors by human eyes can be used to change the form of a pixel unit defined simply by a red pixel, a green pixel, and a blue pixel. A specific way to do this is to share sub-pixels of certain colors between different pixel units. Besides, human eyes are not sensitive to positions of these pixels of certain colors. In this way, with an auxiliary algorithm design, compensation for sub-pixels can be achieved when an image is displayed. Thus, a pixel resolution higher than that in a tradition sense is realized by a relatively small number of sub-pixels through simulation.

Figure 3:
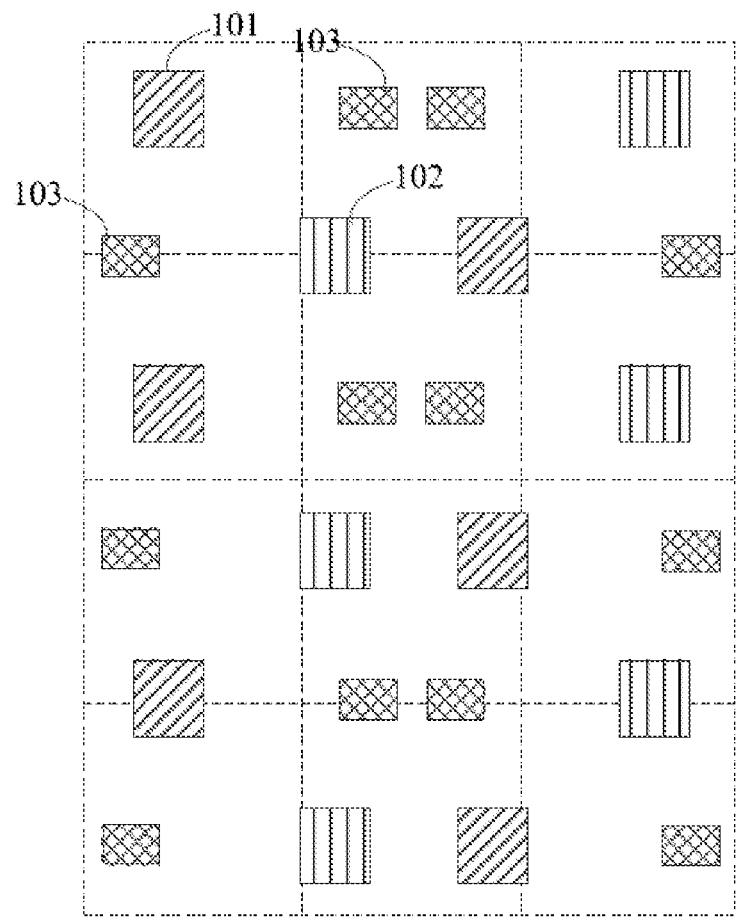
FIG. 3 schematically shows parameter configuration of a process for manufacturing the pixel arrangement provided by the embodiment of the present disclosure.

As shown in FIG. 3, the dashed line rectangle represents a block with 3×4 units, which shows a typical structure of pixel units in the prior art. Because a pixel unit consists of three sub-pixels, a red sub-pixel, a green sub-pixel, and a blue sub-pixel, an area of the block will be provided with 3×4×3 sub-pixels, namely 36 sub-pixels. However, if the pixel arrangement of the present embodiment is used, the area will be provided only with 24 sub-pixels to achieve a same pixel resolution.

As shown in FIG. 3, 24 sub-pixels are arranged in a 6×4 array. Because each of the first sub-pixels 101 and each of the second sub-pixels 102 are shared by adjacent pixel units, the pixel resolution is actually equal to the number of the third sub-pixels 103. According to the pixel sharing mode as illustrated in FIG. 2, a number of bright centers of pixels formed in the 6×4 pixel array in a vertical direction is 1.5 times a number of those in a tradition pixel unit structure, and a number of bright centers of pixels formed in a transverse direction is 1.3 times a number of those in the tradition pixel unit structure.

Besides, in a high-resolution display device, when a single line is displayed (a single line of pixels are arranged), because of the slim line and insufficient brightness, the line can be rendered broader through an algorithm so as to improve a viewer's viewing experience. It can be easily seen from the structure of FIG. 3 that compared with a traditional arrangement, the sharing mode between pixel units as shown in FIG. 2 achieves a relatively broad pixel unit. Such broad pixel units cause no problem in displaying of a single line in a high-resolution display device.

The area shown in FIG. 3 is provided with 12 third sub-pixel units 103. In other words, the 24 sub-pixels altogether form 12 pixels. The pixel arrangement of the present embodiment achieves the performance of high pixel resolution by means of a relatively small number of sub-pixels. The decrease of sub-pixels in number can increase the aperture of pixels, and improve yield rate of a high resolution panel. In addition, due to the decrease of sub-pixels in number, the manufacturing of a high resolution OLED display panel can be made easier and cheaper.

Figure 4:
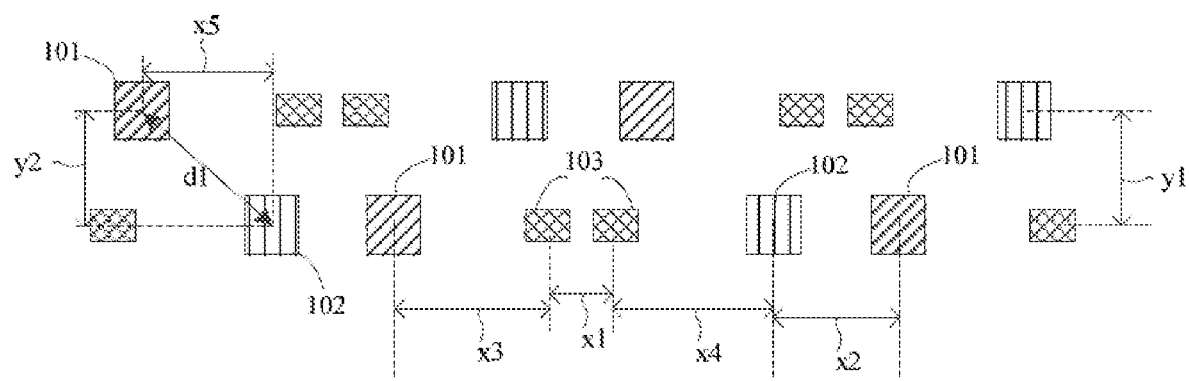
FIG. 4 is another view showing parameter configuration of the process for manufacturing the pixel arrangement provided by the embodiment of the present disclosure.

Specifically, as shown in FIG. 4, x1 is used to represent a distance between two adjacent third sub-pixels 103 in a row; x2 is used to represent a distance between a first sub-pixel 101 and a second sub-pixel 102 that are adjacent to each other in a row; x3 is used to represent a distance between a first sub-pixel 101 and a third sub-pixel 103 that are adjacent to each other in a row; x4 is used to represent a distance between a second sub-pixel 102 and a third sub-pixel 103 that are adjacent to each other in a row; and y1 is used to represent a distance between two sub-pixels located at two adjacent rows along the column direction of the display panel. The practical manufacturing of the OLED sub-pixel array has to satisfy certain requirements in terms of the above-mentioned x1, x2, x3, x4, and y1. For example, each of the distances has to be designed to be larger than a minimum value thereof.

Further, when a precision metal mask is used in an evaporation process for manufacturing an OLED component, the two adjacent third sub-pixels 103 in a row are formed in one piece. That is to say, the two adjacent third sub-pixels 103 occupy a same position in a same mask, and color layers of the two adjacent third sub-pixels 103 are connected to each other to form a sub-pixel structure, and then a light-emitting layer of the two adjacent third sub-pixels 103 is formed through an evaporation hole. Therefore, x1 is actually far smaller than x2, x3, and x4. The above process helps to reduce the difficulty in manufacturing a mask and the third sub-pixels.

Furthermore, as x1 is reduced, it becomes much easier to ensure that each of the distances x2, x3, and x4 is larger than its minimum value, by means of which the first sub-pixels 101 and the second sub-pixels 102 can be made larger, which can help to extend the service life of the OLED display panel.

In a specific embodiment of the present disclosure, the third sub-pixels 103 each have an area smaller than those of the first sub-pixels 101 and the second sub-pixels 102. Preferably, for ease of manufacturing, the first sub-pixels 101 and the second sub-pixels 102 can be designed to have an equal area.

OLEDs can be heated after being turned on, and OLEDs of different colors have different lengths of service life. Green OLEDs have a service life longer than both red and blue OLEDs. In order to effectively extend the service life of the entire OLED display panel, in manufacturing sub-pixels of different colors, green sub-pixels can be manufactured to have an area smaller than those of red and blue OLEDs. In other words, red and blue sub-pixels can be manufactured to have larger sizes, which can help to prolong the service life of the red and blue sub-pixels, thereby improving the service life of the OLED display panel.

Further, in the embodiment of the present disclosure, a first sub-pixel 101 and a second sub-pixel 102 shared by two pixel units are located substantially at a diagonal (see d1 in FIG. 4) of a rectangular block formed by the two pixel units. In a manufacturing process, d1 is also required to be larger than its minimum value. In the present embodiment, d1 is equal to the diagonal in length, and the length of the diagonal is larger than a distance between the first sub-pixel 101 and a second sub-pixel 102 along a row direction or a column direction of the display panel. Specifically, as shown in FIG. 5, d1>x5, and d1>y2. In other words, it is much easier to satisfy the requirement that d1 should be larger than its minimum value. This can help to increase areas of the first sub-pixel 101 and the second sub-pixel 102, thereby improving display quality of the OLED display device.

In another embodiment of the present disclosure, the first sub-pixels 101, the second sub-pixels 102, and the third sub-pixels 103 have a shape of a polygon. In the previous embodiments, the sub-pixels are schematically shown to have a rectangular shape, which however, is only used for illustrating, rather than limiting the present disclosure. In a specific manufacturing process, the first sub-pixels 101, the second sub-pixels 102, and the third sub-pixels 103 may have a shape of a regular or irregular polygon. For example, the sub-pixels can have a shape of an irregular hexagon, so that the aperture ratio of the display panel can be further improved.

The embodiments of the present disclosure further provide an OLED display panel, a pixel array of which is arranged according to the above-mentioned pixel arrangement.

It should also be noted that, for edges of a pixel array formed according to the pixel arrangement of the present disclosure, provided that dimensions of the pixel array are m×n, an upper-left corner of the pixel array (a position at first row and first column) should be provided with a first sub-pixel 101 or a second sub-pixel 102, an upper-right corner thereof (a position at first row and $n^{th}$ column) should be provided with a second sub-pixel 102 or a first sub-pixel

101, and a lower-left corner thereof (a position at $m^{th}$ row and first column) and a lower-right corner thereof (a position at $m^{th}$ row and $n^{th}$ column) should both be provided with a third sub-pixels 103. This is actually a repeated arrangement of the block in FIG. 3.

In the embodiments of the present disclosure, the first sub-pixels and the second sub-pixels are sub-pixels of colors whose positions are not easily recognized. When an image is displayed by the OLED display panel, a first sub-pixel and a second sub-pixel each are shared by two different pixel units to form different pixel units, which is helpful to the improvement of resolution of the display panel.

It should be noted that the above embodiments are described only for better understanding, rather than restricting the present disclosure. Anyone skilled in the art can make amendments to implementing forms and details of the present disclosure without departing from the spirit and scope of the present disclosure. The protection scope of the present disclosure is subject to the scope defined by the claims.

The invention claimed is:

1. A pixel arrangement of an OLED display panel, comprising a plurality of first sub-pixels, a plurality of second sub-pixels, and a plurality of third sub-pixels,
wherein the first sub-pixels and the second sub-pixels are arranged alternately along a row direction of the display panel, wherein a gap between every other pair of first sub-pixel and second sub-pixel is provided with two third sub-pixels along the row direction, and
wherein the first sub-pixels and the third sub-pixels are arranged alternately along a column direction of the display panel to form a first sub-pixel arrangement mode, and the second sub-pixels and the third sub-pixels are arranged alternately along the column direction to form a second sub-pixel arrangement mode, wherein the first sub-pixel arrangement mode and the second sub-pixel arrangement mode are arranged alternately in the row direction.

2. The pixel arrangement according to claim 1, wherein a number of the first sub-pixels is the same as a number of the second sub-pixels, and a number of the third sub-pixels is twice the number of the first sub-pixels or the number of the second sub-pixels.

3. The pixel arrangement according to claim 1, wherein along the row direction of the display panel, a distance between the two third sub-pixels provided in the gap between every other pair of first sub-pixel and second sub-pixel is smaller than a distance between two adjacent first sub-pixel and second sub-pixel, a distance between two adjacent first sub-pixel and third sub-pixel, and two adjacent second sub-pixel and third sub-pixel.

4. The pixel arrangement according to claim 1, wherein the third sub-pixels each have an area smaller than those of the first sub-pixels and the second sub-pixels.

5. The pixel arrangement according to claim 4, wherein the first sub-pixels and the second sub-pixels are equal in area.

6. The pixel arrangement according to claim 1, wherein the first sub-pixels, the second sub-pixels, and the third sub-pixels all have a shape of a polygon.

7. The pixel arrangement according to claim 1, wherein the first sub-pixels, the second sub-pixels, and the third sub-pixels are red sub-pixels, blue sub-pixels, and green sub-pixels, respectively, or the first sub-pixels, the second sub-pixels, and the third sub-pixels are blue sub-pixels, red sub-pixels, and green sub-pixels, respectively.

8. The pixel arrangement according to claim 7, wherein when the OLED display panel is used to display an image, each of the first sub-pixels and each of the second sub-pixels are shared by two pixel units.

9. The pixel arrangement according to claim 8,
wherein a first pixel unit is formed by a first/second sub-pixel in a $(2k+1)^{th}$ row and a $(2k+1)^{th}$ column, a second/first sub-pixel in a $(2k+2)^{th}$ row and a $(2k+2)^{th}$ column, and a third sub-pixel in the $(2k+1)^{th}$ row and the $(2k+2)^{th}$ column, and
wherein a second pixel unit is formed by the first/second sub-pixel in the $(2k+1)^{th}$ row and the $(2k+1)^{th}$ column, the second/first sub-pixel in the $(2k+2)^{th}$ row and the $(2k+2)^{th}$ column, and a third sub-pixel in the $(2k+2)^{th}$ row and the $(2k+1)^{th}$ column,
wherein k is an integer larger than or equal to zero.

10. An OLED display panel comprising a pixel array which is formed according to a following pixel arrangement,
wherein the pixel arrangement comprises a plurality of first sub-pixels, a plurality of second sub-pixels, and a plurality of third sub-pixels,
wherein the first sub-pixels and the second sub-pixels are arranged alternately along a row direction of the display panel, wherein a gap between every other pair of first sub-pixel and second sub-pixel is provided with two third sub-pixels along the row direction, and
wherein the first sub-pixels and the third sub-pixels are arranged alternately along a column direction of the display panel to form a first sub-pixel arrangement mode, and the second sub-pixels and the third sub-pixels are arranged alternately along the column direction to form a second sub-pixel arrangement mode, wherein the first sub-pixel arrangement mode and the second sub-pixel arrangement mode are arranged alternately in the row direction.

11. The OLED display panel according to claim 10, wherein a number of the first sub-pixels is the same as a number of the second sub-pixels, and a number of the third sub-pixels is twice the number of the first sub-pixels or the number of the second sub-pixels.

12. The OLED display panel according to claim 10, wherein along the row direction of the display panel, a distance between the two third sub-pixels provided in the gap between every other pair of first sub-pixel and second sub-pixel is smaller than a distance between two adjacent first sub-pixel and second sub-pixel, a distance between two adjacent first sub-pixel and third sub-pixel, and two adjacent second sub-pixel and third sub-pixel.

13. The OLED display panel according to claim 10, wherein the third sub-pixels each have an area smaller than those of the first sub-pixels and the second sub-pixels.

14. The OLED display panel according to claim 13, wherein the first sub-pixels and the second sub-pixels are equal in area.

15. The OLED display panel according to claim 10, wherein the first sub-pixels, the second sub-pixels, and the third sub-pixels all have a shape of a polygon.

16. The OLED display panel according to claim 10, wherein the first sub-pixels, the second sub-pixels, and the third sub-pixels are red sub-pixels, blue sub-pixels, and green sub-pixels, respectively, or the first sub-pixels, the second sub-pixels, and the third sub-pixels are blue sub-pixels, red sub-pixels, and green sub-pixels, respectively.

17. The OLED display panel according to claim 16, wherein when the OLED display panel is used to display an image, each of the first sub-pixels and each of the second sub-pixels are shared by two pixel units.

18. The OLED display panel according to claim 17,
wherein a first pixel unit is formed by a first/second sub-pixel in a $(2k+1)^{th}$ row and a $(2k+1)^{th}$ column, a second/first sub-pixel in a $(2k+2)^{th}$ row and a $(2k+2)^{th}$ column, and a third sub-pixel in the $(2k+1)^{th}$ row and the $(2k+2)^{th}$ column, and
wherein a second pixel unit is formed by the first/second sub-pixel in the $(2k+1)^{th}$ row and the $(2k+1)^{th}$ column, the second/first sub-pixel in the $(2k+2)^{th}$ row and the $(2k+2)^{th}$ column, and a third sub-pixel in the $(2k+2)^{th}$ row and the $(2k+1)^{th}$ column,
wherein k is an integer larger than or equal to zero.

* * * * *